(12) United States Patent
Kim et al.

(10) Patent No.: US 8,664,724 B2
(45) Date of Patent: Mar. 4, 2014

(54) SEMICONDUCTOR DEVICES HAVING SLIT WELL TUB

(75) Inventors: Se-Young Kim, Seoul (KR); Gi-Young Yang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 394 days.

(21) Appl. No.: 13/081,128

(22) Filed: Apr. 6, 2011

(65) Prior Publication Data

US 2011/0260254 A1    Oct. 27, 2011

(30) Foreign Application Priority Data

Apr. 27, 2010    (KR) .................. 10-2010-0039090

(51) Int. Cl.
*H01L 23/62*    (2006.01)
(52) U.S. Cl.
USPC .................. 257/357; 257/409; 257/E29.102
(58) Field of Classification Search
USPC .................. 257/357, 409, E29.102
See application file for complete search history.

(56) References Cited

U.S. PATENT DOCUMENTS

| | | | |
|---|---|---|---|
| 6,469,354 B1 * | 10/2002 | Hirata | 257/358 |
| 6,885,529 B2 | 4/2005 | Ker et al. | |
| 7,064,358 B2 | 6/2006 | Manna et al. | |
| 7,582,938 B2 | 9/2009 | Chen | |
| 7,737,526 B2 * | 6/2010 | Williams et al. | 257/506 |
| 2002/0167348 A1 * | 11/2002 | Kim | 327/310 |
| 2008/0285187 A1 | 11/2008 | Van Camp et al. | |

* cited by examiner

*Primary Examiner* — Howard Weiss
*Assistant Examiner* — Steven Rao
(74) *Attorney, Agent, or Firm* — Myers Bigel Sibley & Sajovec, P.A.

(57) ABSTRACT

An electrostatic discharge semiconductor device can include a first conductivity type substrate that includes inner first conductivity type wells therein and a plurality of gate electrodes that are on an active region of the substrate. A second conductivity type well can be located in the substrate beneath the plurality of gate electrodes including at least one slit therein providing electrical contact between the inner first conductivity type wells and a first conductivity type outer well outside the active region.

20 Claims, 9 Drawing Sheets

21 23  33A  33S  33A  33S  33A

SEMICONDUCTOR DEVICES HAVING SLIT WELL TUB

CROSS-REFERENCE TO RELATED APPLICATION

This application claims priority under 35 U.S.C. §119 to Korean Patent Application No. 10-2010-0039090 filed on Apr. 27, 2010, the disclosure of which is hereby incorporated herein by reference in its entirety.

BACKGROUND

1. Field

Embodiments of the inventive concept relate to a semiconductor device and, more particularly, to a semiconductor device having a slit well tub.

2. Description of Related Art

Studies have been made on the improvement of response characteristics of an electrostatic discharge (ESD) protection device. However, these studies have encountered various difficulties in reducing a trigger voltage of the ESD protection device.

SUMMARY

Embodiments according to the inventive concept can provide electrostatic discharge protection devices including slit well tubs. Pursuant to these embodiments, a semiconductor device can include first inner conductive wells located in a first conductive semiconductor substrate. A plurality of gate electrodes can be located on the first inner conductive wells and source and drain regions can be located in the first inner conductive wells. A first outer conductive well is located in the first conductive semiconductor substrate, and is disposed outside the first inner conductive wells. A second conductive well can be located under the source and drain regions, and can have at least one slit therein. A first conductive guard ring can be located in the first outer conductive well, and is electrically coupled to the first inner conductive wells via the at least one slit.

In some embodiments according to the inventive concept, the first and second conductivity types can be opposite conductivity types. In some embodiments according to the inventive concept, the second conductive well can separate portions of the first inner conductive wells from portions of the first conductive semiconductor substrate, and the first inner conductive wells can be in contact with the first conductive semiconductor substrate through the at least one slit.

In some embodiments according to the inventive concept, the device can also include a second conductive guard ring located between the first inner conductive wells and the first outer conductive well and can be in contact with the second conductive well. In some embodiments according to the inventive concept, the first inner conductive wells can be separated from the first outer conductive well by the second conductive guard ring.

In some embodiments according to the inventive concept, the first conductive guard ring can be in contact with the second conductive guard ring. In some embodiments according to the inventive concept, the device can further include an isolation layer located between the first inner conductive wells and the first outer conductive well. In some embodiments according to the inventive concept, the isolation layer can be between the second conductive guard ring and the source regions, and located between the second conductive guard ring and the drain regions.

In some embodiments according to the inventive concept, the isolation layer can be located between the first conductive guard ring and the second conductive guard ring. In some embodiments according to the inventive concept, the device can further include an isolation layer located between the first inner conductive wells and the first outer conductive well and can be in contact with the second conductive well. In some embodiments according to the inventive concept, the first inner conductive wells can be separated from the first outer conductive well by the isolation layer.

In some embodiments according to the inventive concept, the at least one slit is located at about a central portion of the second conductive well. In some embodiments according to the inventive concept, the at least one slit can be aligned parallel to one of the plurality of gate electrodes.

In some embodiments according to the inventive concept, the device can be an electrostatic discharge device that includes an input/output pad that can be electrically connected to the drain regions and a ground interconnection that can be electrically connected to the gate electrodes, the source regions, and the first conductive guard ring.

In some embodiments according to the inventive concept, a semiconductor device can include inner P-wells located in a P-type semiconductor substrate and a plurality of gate electrodes located on the inner P-wells. Source and drain regions can be located in the inner P-wells and an outer P-well can be located in the P-type semiconductor substrate, outside the inner P-wells. An N-well can be located between the inner P-wells and the P-type semiconductor substrate, and can have at least one slit therein that electrically connects the inner P-wells and the P-type semiconductor substrate. An N-type guard ring can be located between the inner P-wells and the outer P-well, and can be in contact with the N-well. A P-type guard ring can be located in the outer P-well where the inner P-wells can be in contact with the P-type semiconductor substrate through the at least one slit.

In some embodiments according to the inventive concept, an electrostatic discharge semiconductor device can include a first conductivity type substrate that includes inner first conductivity type wells therein and a plurality of gate electrodes that are on an active region of the substrate. A second conductivity type well can be located in the substrate beneath the plurality of gate electrodes including at least one slit therein providing electrical contact between the inner first conductivity type wells and a first conductivity type outer well outside the active region.

DESCRIPTION OF EMBODIMENTS ACCORDING TO THE INVENTIVE CONCEPT

Figure 1:
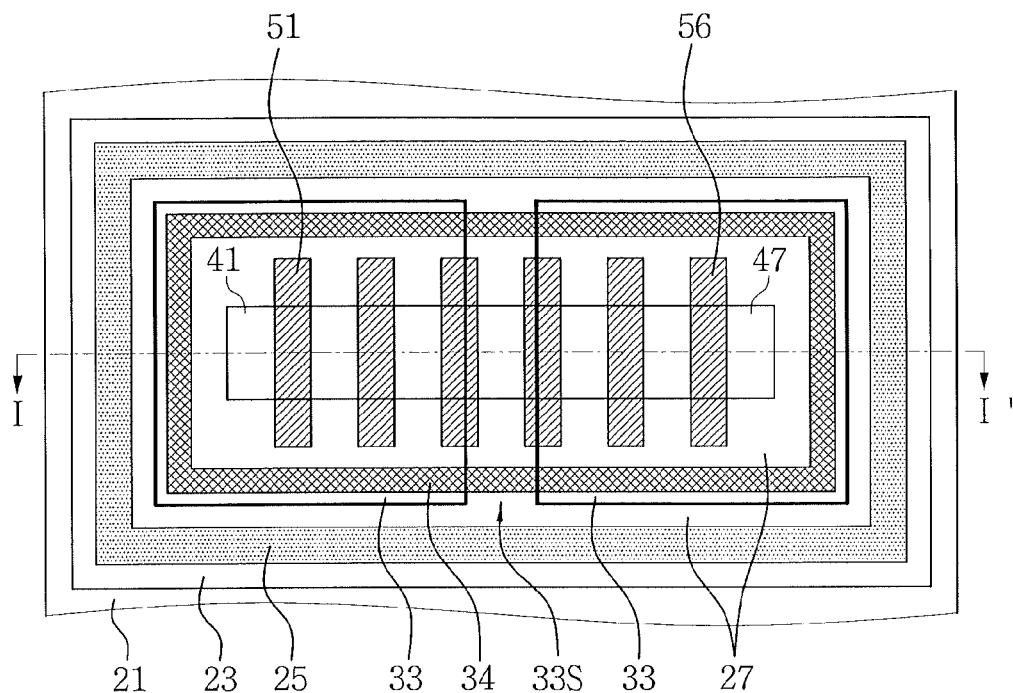
FIG. 1 is a plan view of a semiconductor device according to a first embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
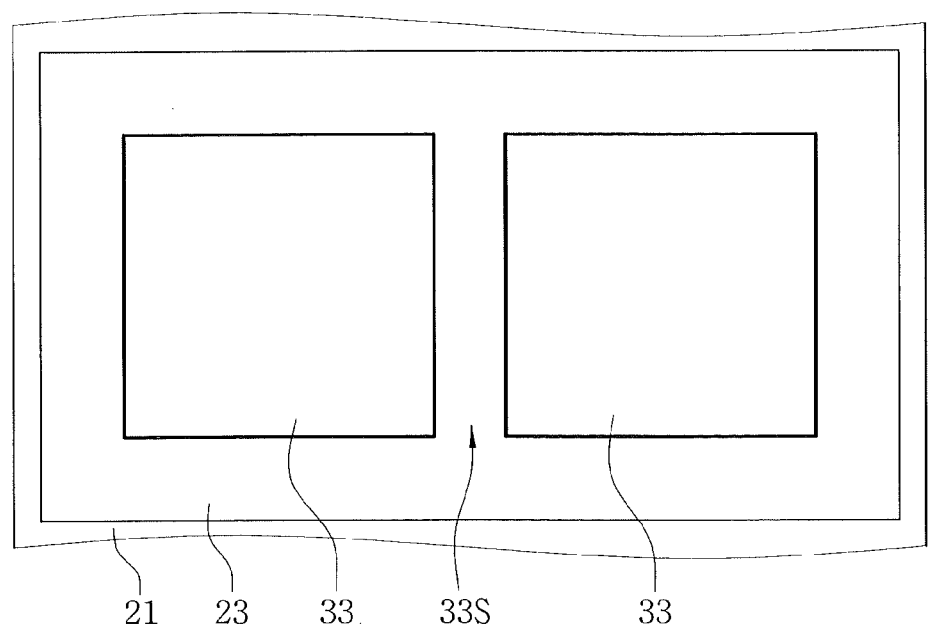
FIG. 2 is a plan view of a part of the semiconductor device of FIG. 1.
Figure 3:
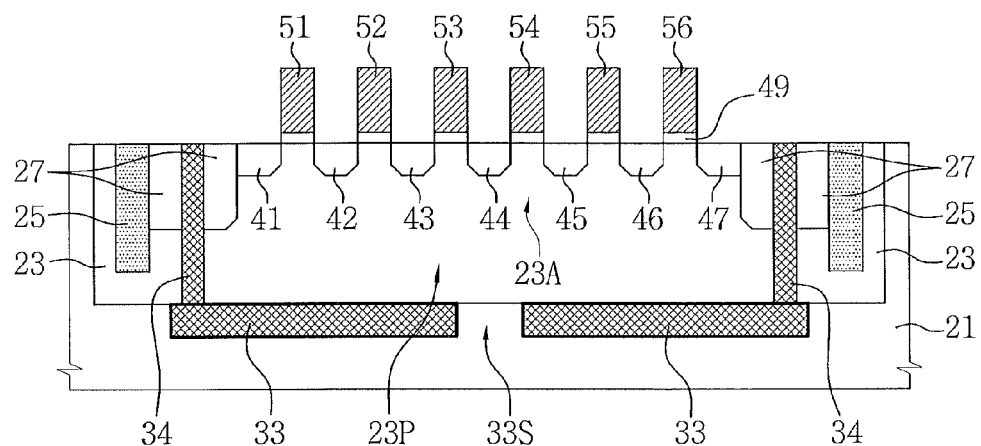
FIG. 3 is a cross-sectional view taken along line I-I' of FIG. 1.
Figure 4:
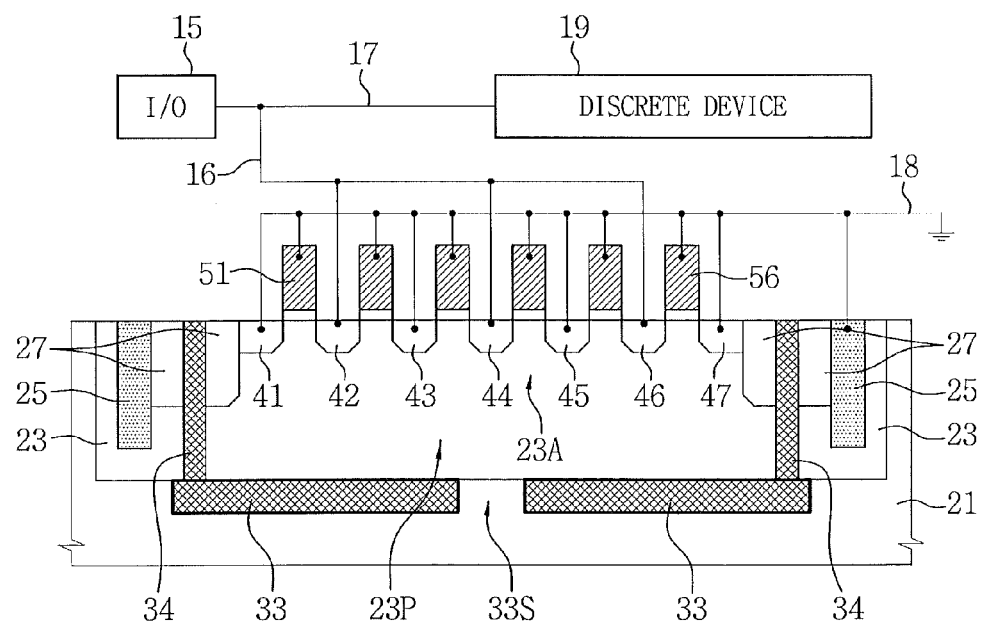
FIG. 4 illustrates a combination of the cross-sectional view of FIG. 3 and a schematic circuit diagram of a semiconductor device according to a first embodiment of the inventive concept.
Figure 5:
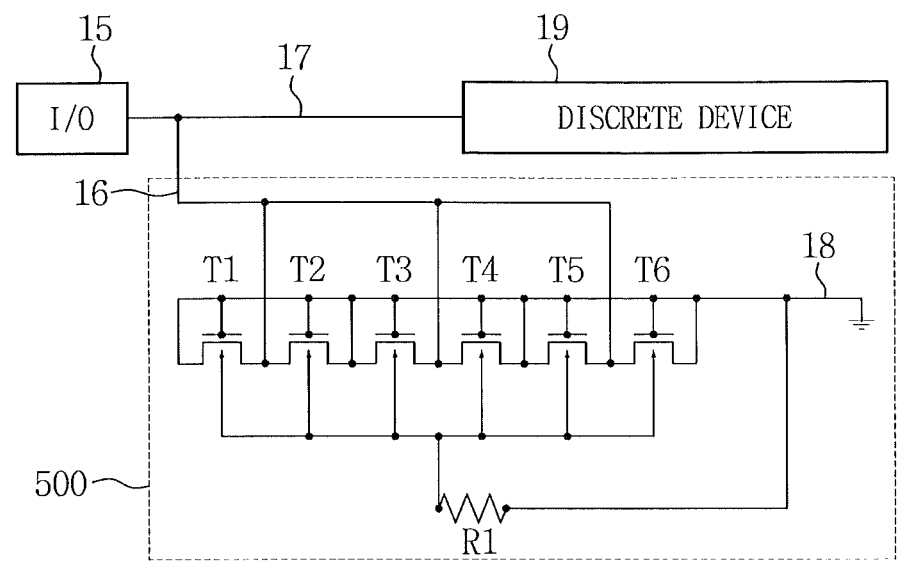
FIG. 5 is an equivalent circuit diagram of FIG. 4.

FIG. 1 is a plan view of a semiconductor device according to a first embodiment of the inventive concept. FIG. 2 is a plan view of a part of the semiconductor device of FIG. 1. FIG. 3 is a cross-sectional view taken along line I-I' of FIG. 1. Further, FIG. 4 illustrates a combination of the cross-sectional view of FIG. 3 and a schematic circuit of a semiconductor device according to a first embodiment of the inventive concept. FIG. 5 is an equivalent circuit diagram of FIG. 4.

Referring to FIGS. 1, 2 and 3, a semiconductor device according to a first embodiment of the inventive concept may include first conductive wells 23, 23A and 23P, a first conductive guard ring 25, a second conductive well 33, and a second conductive guard ring 34 which are formed in a first conductive semiconductor substrate 21. In the first embodiment of the inventive concept, the first conductivity type may be a P-type or an N-type. Further, the first conductivity type may be different from the second conductivity type. For example, if the first conductivity type is a P-type, the second conductivity type may be an N-type. In contrast, if the first conductivity type is an N-type, the second conductivity type may be a P-type. The following description will be made on the assumption that the first conductivity type is a P-type, and the second conductivity type is an N-type.

In some embodiments according to the inventive concept, guard rings may be used to reduce the likelihood of damage from voltage latch-up resulting from electrostatic discharge and voltage overshooting or undershooting. Absorption of high current by the guard rings from an ESD or a voltage overshoot or undershoot may help prevent damage of the ESD device from overheating and resists current further flow to the internal circuits of the semiconductor chip.

Thus, the first conductive semiconductor substrate 21 will be designated a P-type semiconductor substrate 21, and the first conductive wells 23, 23A and 23P will be designated P-wells 23, 23A and 23P. The first conductive guard ring 25 will be designated a P-type guard ring 25. The second conductive well 33 will be designated an N-well 33, and the second conductive guard ring 34 will be designated an N-type guard ring 34. Here, the P-wells 23, 23A and 23P may be divided into inner P-wells 23A and 23P and an outer P-well 23. The inner P-wells 23A and 23P may be divided into a first region 23A and a second region 23P. The P-type semiconductor substrate 21 may be a single crystal semiconductor wafer such as a silicon wafer containing P-type impurity ions. The P-wells 23, 23A and 23P may be a single crystal semiconductor containing P-type impurity ions at a higher concentration than the P-type semiconductor substrate 21. Here, the P-type impurity ions may be boron (B).

As illustrated in FIG. 3, the P-wells 23, 23A and 23P may be disposed on a surface of the P-type semiconductor substrate 21. The N-well 33 may be formed under the inner P-wells 23A and 23P. For example, the N-well 33 may be interposed between the inner P-wells 23A and 23P and the P-type semiconductor substrate 21. The N-well 33 may be a single crystal semiconductor containing N-type impurity ions. Here, the N-type impurity ions may be phosphorus (P) or arsenic (As). The N-well 33 may have at least one slit 33S. The inner P-wells 23A and 23P may contact the P-type semiconductor substrate 21 through the slit 33S. As illustrated in FIG. 2, when the slit 33S crosses the N-well 33, the N-well 33 may be divided into two regions. The slit 33S may pass through the two regions of the N-well 33.

An isolation layer 27 defining the first region 23A may be formed in the P-wells 23, 23A and 23P. The isolation layer 27 may be formed to surround sidewalls of the first region 23A. The isolation layer 27 may be formed using a shallow trench isolation (STI) technique. The isolation layer 27 may be formed of an insulating layer such as a silicon oxide layer, a silicon nitride layer, a silicon oxynitride layer, or a combination thereof. The isolation layer 27 may overlap the N-well 33.

In some embodiments according to the inventive concept, the isolation layer 27 may be separated from the N-well 33. In some embodiments according to the inventive concept, the isolation layer 27 may be in contact with the N-well 33.

A plurality of gate electrodes 51, 52, 53, 54, 55 and 56 may be arranged across the first region 23A. The gate electrodes 51, 52, 53, 54, 55 and 56 may be configured as first to sixth gate electrodes 51, 52, 53, 54, 55 and 56 which are parallel to one another. A gate dielectric layer 49 may be interposed between the gate electrodes 51, 52, 53, 54, 55 and 56 and the first region 23A. The gate electrodes 51, 52, 53, 54, 55 and 56 may be formed of a conductive layer such as a polysilicon layer, a metal silicide layer, a metal layer, or a combination thereof. The gate dielectric layer 49 may be formed of an insulating layer such as a silicon oxide layer, a silicon nitride layer, a silicon oxynitride layer, a high-K dielectric layer, or a combination thereof. As illustrated in FIG. 1, the gate electrodes 51, 52, 53, 54, 55 and 56 may completely cross the first region 23A, and extend on the isolation layer 27. Although, six gate electrodes 51, 52, 53, 54, 55 and 56, are shown more or less may be used, such as two to twenty electrodes.

Source regions 41, 43, 45 and 47 and drain regions 42, 44 and 46 may be disposed on the first region 23A of both sides of the gate electrodes 51, 52, 53, 54, 55 and 56. A bottom of the isolation layer 27 may be formed at a lower level than the source regions 41, 43, 45 and 47 and the drain regions 42, 44 and 46. The source regions 41, 43, 45 and 47 and the drain regions 42, 44 and 46 may be formed by implanting second conductivity type impurity ions. The following description will be made on the assumption that the source regions 41, 43, 45 and 47 and the drain regions 42, 44 and 46 are implanted with N-type impurity ions.

For example, the first drain region 42 may be disposed on the first region 23A between the first and second gate electrodes 51 and 52. The second drain region 44 may be disposed on the first region 23A between the third and fourth gate electrodes 53 and 54. The third drain region 46 may be disposed on the first region 23A between the fifth and sixth gate electrodes 55 and 56. Further, the first source region 41 may be disposed on the first region 23A between the first gate electrode 51 and the isolation layer 27. The second source region 43 may be disposed on the first region 23A between the second and third gate electrodes 52 and 53. The third source region 45 may be disposed on the first region 23A between the fourth and fifth gate electrodes 54 and 55. The fourth source region 47 may be disposed on the first region 23A between the sixth gate electrode 56 and the isolation layer 27.

The slit 33S may be disposed parallel to the gate electrodes 51, 52, 53, 54, 55 and 56. For example, the slit 33S may be aligned between the third and fourth gate electrodes 53 and 54.

The N-type guard ring 34 may pass between the inner P-wells 23A and 23P and the outer P-well 23 to be in contact with the N-well 33. That is, the N-type guard ring 34 may define the inner P-wells 23A and 23P. The N-type guard ring 34 may pass through the isolation layer 27. The second region 23P may be disposed under the first region 23A. Sidewalls of the second region 23P may be completely surrounded by the N-type guard ring 34. The first region 23A may also be completely surrounded by the N-type guard ring 34. That is, the first and second regions 23A and 23P may be isolated from the outer P-well 23 by the N-type guard ring 34 and the isolation layer 27. However, the first and second regions 23A and 23P may be electrically connected with the P-type semiconductor substrate 21 through the slit 33S. The N-type guard ring 34 may be formed of a semiconductor layer such as a silicon layer containing N-type impurity ions.

In some embodiments according to the inventive concept, the N-well 33 may be formed within the second region 23P.

The P-type guard ring 25 may be provided outside the N-type guard ring 34. The P-type guard ring 25 may be disposed to surround the outsides of the inner P-wells 23A and 23P and the N-type guard ring 34. The P-type guard ring 25 may be formed of a semiconductor layer containing P-type impurity ions at a concentration higher than those of the P-wells 23, 23A and 23P. The P-type guard ring 25 may be in contact with the outer P-well 23. The P-type guard ring 25 may be electrically connected with the inner P-wells 23A and 23P via the outer P-well 23 and the P-type semiconductor substrate 21. The isolation layer 27 may be interposed between the P-type guard ring 25 and the N-type guard ring 34.

In some embodiments according to the inventive concept, sidewalls of the P-type guard ring 25 may be in contact with sidewalls of the N-type guard ring 34.

As described above, the N-well 33 may include at least one slit 33S. The regions of the N-well 33, separated by the at least one slit 33S, and the N-type guard ring 34 may provide a slit well tub. The slit 33S may serve to provide an electrical connection path between the P-type guard ring 25 and the inner P-wells 23A and 23P, which are otherwise electrically isolated from one another by the N-well 33 and the N-type guard ring 34. In some embodiments according to the inventive concept, the otherwise electrical isolation can be provided by other structures (such as the isolation layer 27) in combination with the N-well 33.

Referring to FIGS. 4 and 5, a semiconductor device according to a first embodiment of the inventive concept may include an input/output (I/O) pad 15, a discrete device 19, and a grounded gate N-type metal oxide semiconductor (ggNMOS) 500. The ggNMOS 500 may be electrically connected to the I/O pad 15 via a first interconnection 16. The discrete device 19 may be electrically connected to the I/O pad 15 via a second interconnection 17.

The ggNMOS 500 may be formed of the P-type semiconductor substrate 21, the outer P-well 23, the P-type guard ring 25, the N-well 33, the N-type guard ring 34, the inner P-wells 23A and 23P, the source regions 41, 43, 45 and 47, the drain regions 42, 44 and 46, and the gate electrodes 51, 52, 53, 54, 55 and 56. The drain regions 42, 44 and 46 may be electrically connected to the first interconnection 16. The gate electrodes 51, 52, 53, 54, 55 and 56, the source regions 41, 43, 45 and 47, and the P-type guard ring 25 may be electrically connected to a ground interconnection 18. The I/O pad 15 may be disposed on the P-type semiconductor substrate 21 to be adjacent to the ggNMOS 500. The gate electrodes 51, 52, 53, 54, 55 and 56, the source regions 41, 43, 45 and 47, the drain regions 42, 44 and 46, and the inner P-wells 23A and 23P may be interpreted as first to sixth finger transistors T1, T2, T3, T4, T5 and T6.

The inner P-wells 23A and 23P may be electrically connected to the ground interconnection 18 via the slit 33S, the P-type semiconductor substrate 21, the outer P-well 23, and the P-type guard ring 25. The inner P-wells 23A and 23P, the P-type semiconductor substrate 21, the outer P-well 23, and the P-type guard ring 25 may be interpreted as a substrate resistance R1 connected in series thereto. The P-type semiconductor substrate 21 shows an electric resistance higher than that of the P-wells 23, 23A and 23P due to a difference in impurity concentration. An electrical connection path between the inner P-wells 23A and 23P and the P-type guard ring 25 may lengthened due to the presence of the N-well 33, the slit 33S, and the N-type guard ring 34. Thus, the substrate resistance R1 may be increased. In this case, the ggNMOS 500 may show improved response characteristics such as reduction in turn-on time, reduction in trigger voltage, reduction in holding voltage, and reduction in heating value.

Furthermore, in each of the first to sixth finger transistors T1, T2, T3, T4, T5 and T6, the substrate resistance R1 may show a relatively uniform characteristic. For example, the first to sixth finger transistors T1, T2, T3, T4, T5 and T6 may show a relatively uniform turn-on time characteristic. Thus, the ggNMOS 500 has excellent current drivability.

Figure 6:
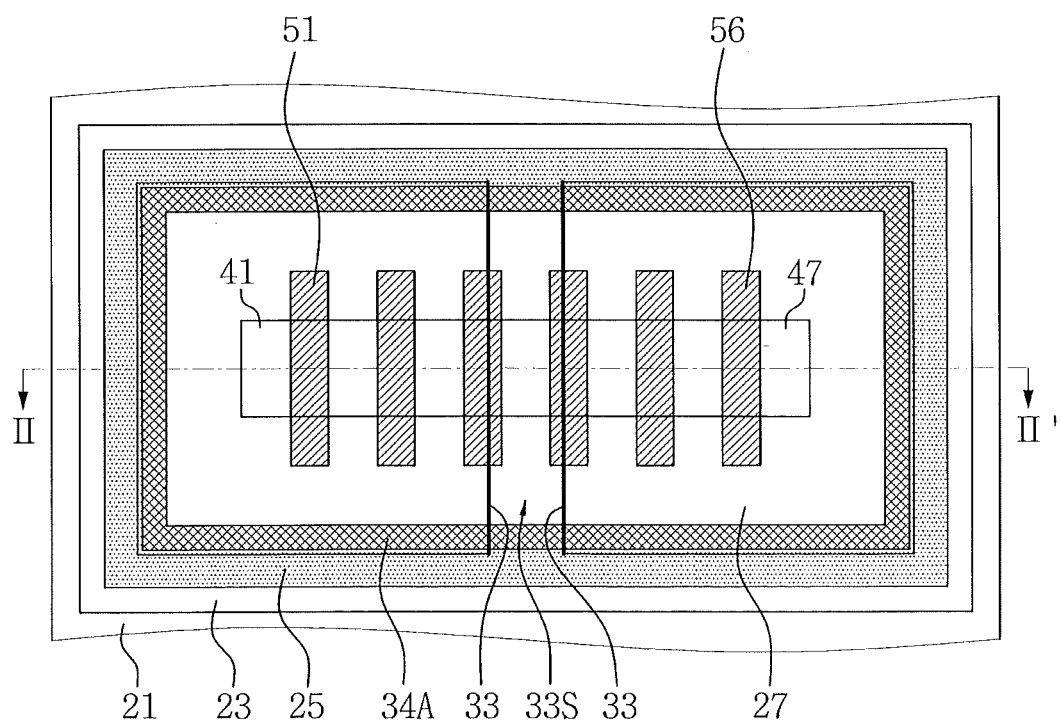
FIG. 6 is a plan view of a semiconductor device according to a second embodiment of the inventive concept.
Figure 7:
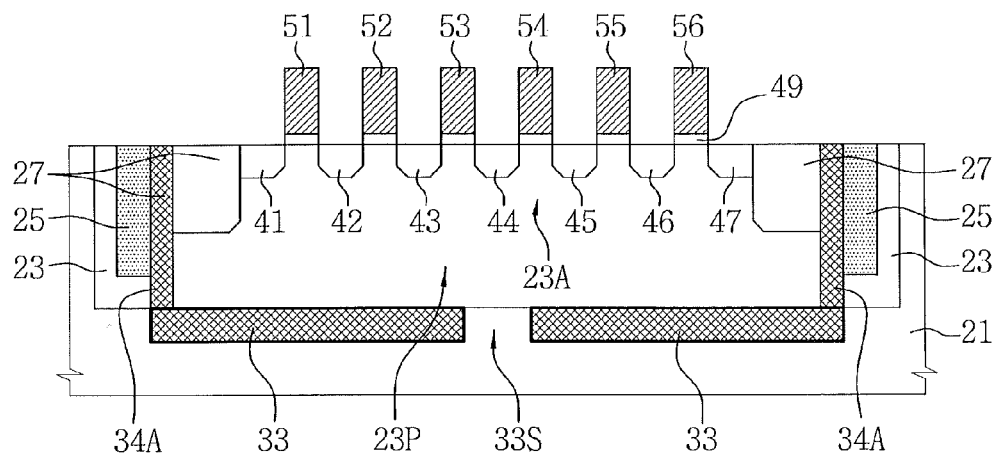
FIG. 7 is a cross-sectional view taken along line II-II' of FIG. 6.

FIG. 6 is a plan view of a semiconductor device according to a second embodiment of the inventive concept, and FIG. 7 is a cross-sectional view taken along line II-II' of FIG. 6.

Referring to FIGS. 6 and 7, a semiconductor device according to a second embodiment of the inventive concept may include P-wells 23, 23A and 23P, a P-type guard ring 25, an N-well 33, and an N-type guard ring 34A, all of which are formed in a P-type semiconductor substrate 21. Sidewalls of the P-type guard ring 25 may be in contact with sidewalls of the N-type guard ring 34A.

The P-wells 23, 23A and 23P may be divided into inner P-wells 23A and 23P and an outer P-well 23. The inner P-wells 23A and 23P may be divided into a first region 23A and a second region 23P. The N-well 33 may be formed under the inner P-wells 23A and 23P. The N-well 33 may include at least one slit 33S. An isolation layer 27 defining the first region 23A may be formed in the P-wells 23, 23A and 23P.

A plurality of gate electrodes 51, 52, 53, 54, 55 and 56 may be arranged across the first region 23A. The gate electrodes 51, 52, 53, 54, 55 and 56 may be configured of first to sixth gate electrodes 51, 52, 53, 54, 55 and 56 which are parallel to one another. A gate dielectric layer 49 may be interposed between the gate electrodes 51, 52, 53, 54, 55 and 56 and the first region 23A. Source regions 41, 43, 45 and 47 and drain regions 42, 44 and 46 may be disposed on the first region 23A of both sides of the gate electrodes 51, 52, 53, 54, 55 and 56. The slit 33S may be disposed parallel to the gate electrodes 51, 52, 53, 54, 55 and 56. For example, the slit 33S may be aligned between the third and fourth gate electrodes 53 and 54.

The N-type guard ring 34A may pass between the inner P-wells 23A and 23P and the outer P-well 23 to be in contact with the N-well 33. That is, the N-type guard ring 34A may define the inner P-wells 23A and 23P. The second region 23P may be disposed under the first region 23A. Sidewalls of the second region 23P may be completely surrounded by the N-type guard ring 34A. The first region 23A may also be completely surrounded by the N-type guard ring 34A. That is, the first and second regions 23A and 23P may be isolated from the outer P-well 23 by the N-type guard ring 34A and the isolation layer 27. However, the inner P-wells 23A and 23P may be electrically connected with the P-type semiconductor substrate 21 through the slit 33S.

The P-type guard ring 25 may be provided outside the N-type guard ring 34A. The P-type guard ring 25 may be disposed to surround the outsides of the inner P-wells 23A and 23P and the N-type guard ring 34A. The P-type guard ring 25 may be formed of a semiconductor layer containing P-type impurity ions at a concentration higher than those of the P-wells 23, 23A and 23P. The P-type guard ring 25 may be electrically connected with the inner P-wells 23A and 23P via the outer P-well 23 and the P-type semiconductor substrate 21.

As described above, the N-well 33 may include at least one slit 33S. The N-well 33 and the N-type guard ring 34A may constitute a slit well tub. The slit 33S may serve to provide an electrical connection path between the P-type guard ring 25 and the inner P-wells 23A and 23P. The electrical connection path between the inner P-wells 23A and 23P and the P-type guard ring 25 may be relatively lengthened and made uniform due to the presence of the N-well 33, the slit 33S, and the N-type guard ring 34A.

Figure 8:
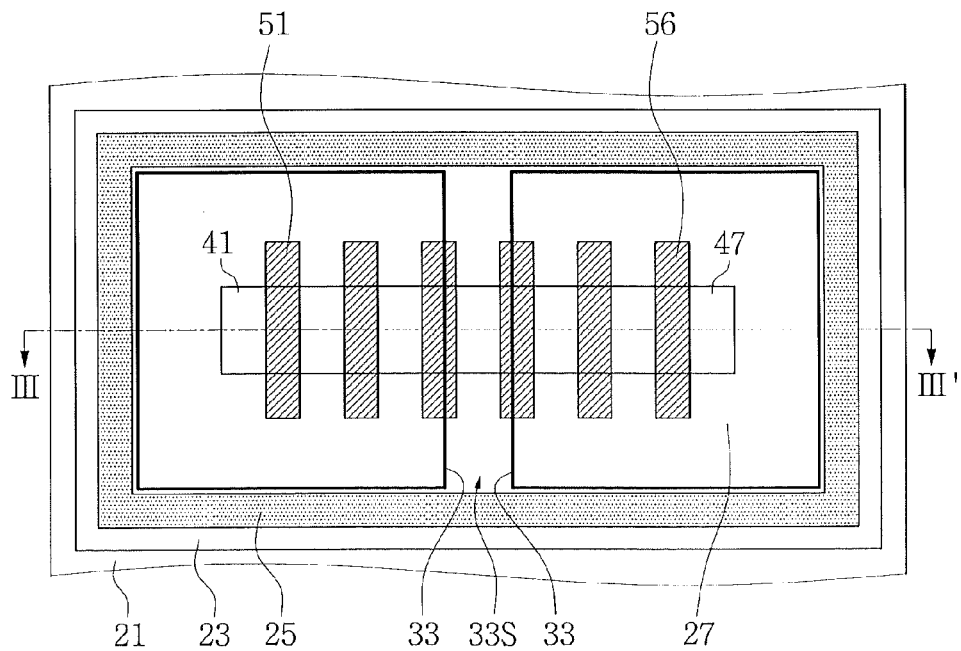
FIG. 8 is a plan view of a semiconductor device according to a third embodiment of the inventive concept.
Figure 9:
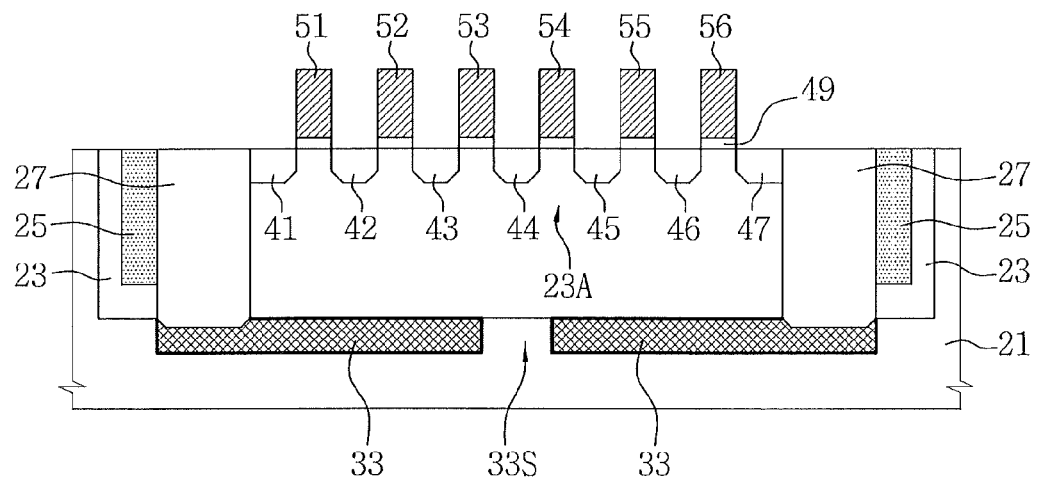
FIG. 9 is a cross-sectional view taken along line of FIG. 8.

FIG. 8 is a plan view of a semiconductor device according to a third embodiment of the inventive concept, and FIG. 9 is a cross-sectional view taken along line III-III' of FIG. 8.

Referring to FIGS. 8 and 9, a semiconductor device according to a third embodiment of the inventive concept may include P-wells 23 and 23A, a P-type guard ring 25, an N-well 33, and an isolation layer 27, all of which are formed in a P-type semiconductor substrate 21.

The P-wells 23 and 23A may be divided into an inner P-well 23A and an outer P-well 23. The isolation layer 27 may pass between the inner P-well 23A and the outer P-well 23 to be in contact with the N-well 33. The N-well 33 may be formed under the inner P-well 23A. The N-well 33 may include at least one slit 33S. Sidewalls of the P-type guard ring 25 may be in contact with sidewalls of the isolation layer 27. In some embodiments according to the inventive concept, the P-type guard ring 25 may be separated from the isolation layer 27.

A plurality of gate electrodes 51, 52, 53, 54, 55 and 56 may be arranged across the inner P-well 23A. The gate electrodes 51, 52, 53, 54, 55 and 56 may be configured of first to sixth gate electrodes 51, 52, 53, 54, 55 and 56 which are parallel to one another. A gate dielectric layer 49 may be interposed between the gate electrodes 51, 52, 53, 54, 55 and 56 and the inner P-well 23A. Source regions 41, 43, 45 and 47 and drain regions 42, 44 and 46 may be disposed on the inner P-well 23A of both sides of the gate electrodes 51, 52, 53, 54, 55 and 56. The slit 33S may be disposed parallel to the gate electrodes 51, 52, 53, 54, 55 and 56. For example, the slit 33S may be aligned between the third and fourth gate electrodes 53 and 54.

Sidewalls of the inner P-well 23A may be completely surrounded by the isolation layer 27. That is, the inner P-well 23A may be isolated from the outer P-well 23 by the isolation layer 27. However, the inner P-well 23A may be electrically connected with the P-type semiconductor substrate 21 through the slit 33S.

The P-type guard ring 25 may be provided outside the isolation layer 27. The P-type guard ring 25 may be electrically connected with the inner P-well 23A via the outer P-well 23 and the P-type semiconductor substrate 21.

As described above, the N-well 33 may include at least one slit 33S. The slit 33S may serve to provide an electrical connection path between the P-type guard ring 25 and the inner P-well 23A. The electrical connection path between the inner P-well 23A and the P-type guard ring 25 may be relatively lengthened and made uniform due to the presence of the N-well 33, the slit 33S, and the isolation layer 27.

Figure 10:
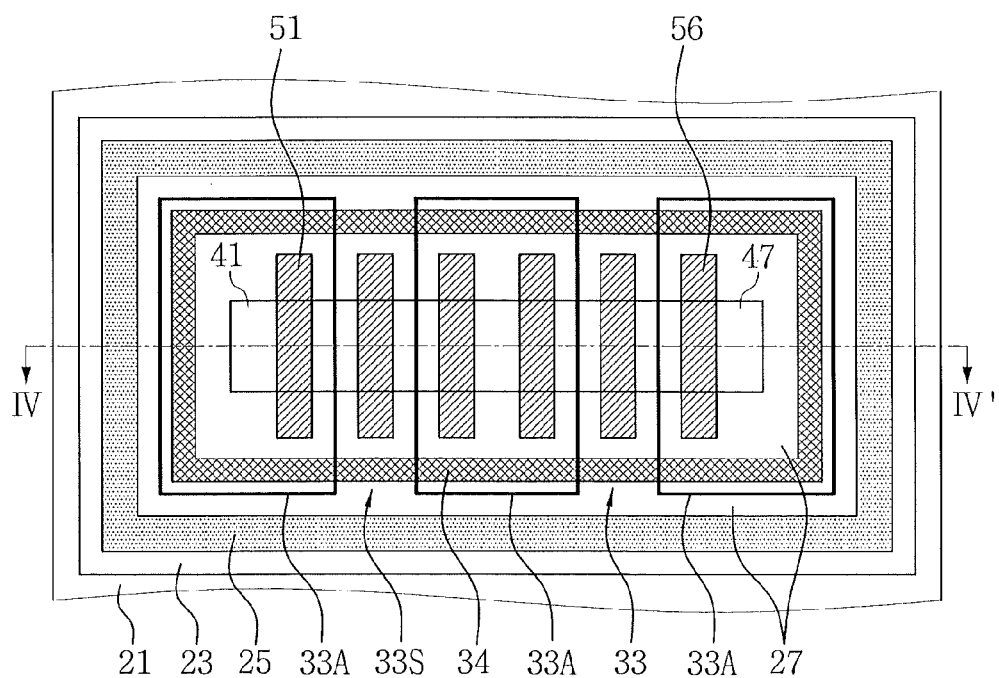
FIG. 10 is a plan view of a semiconductor device according to a fourth embodiment of the inventive concept.
Figure 11:
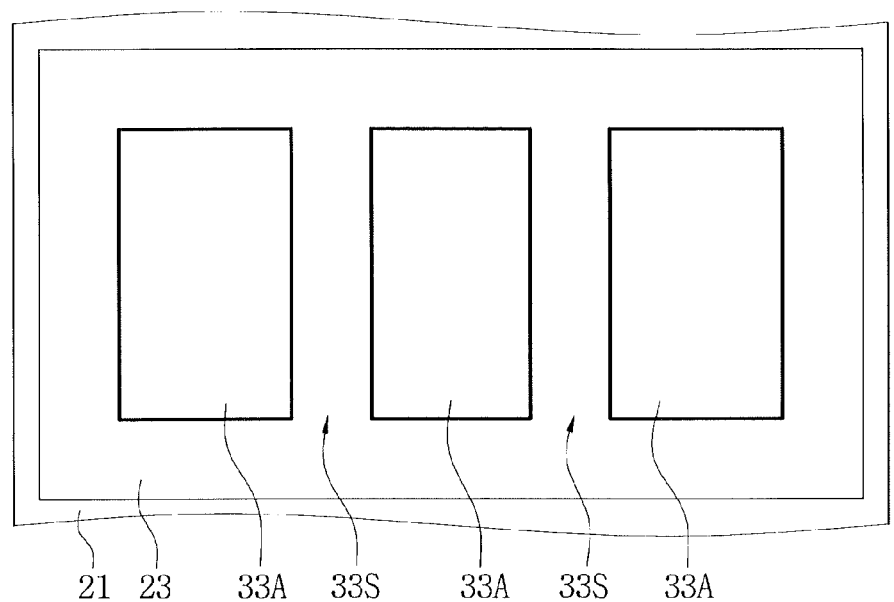
FIG. 11 is a plan view of a part of the semiconductor device of FIG. 10.
Figure 12:
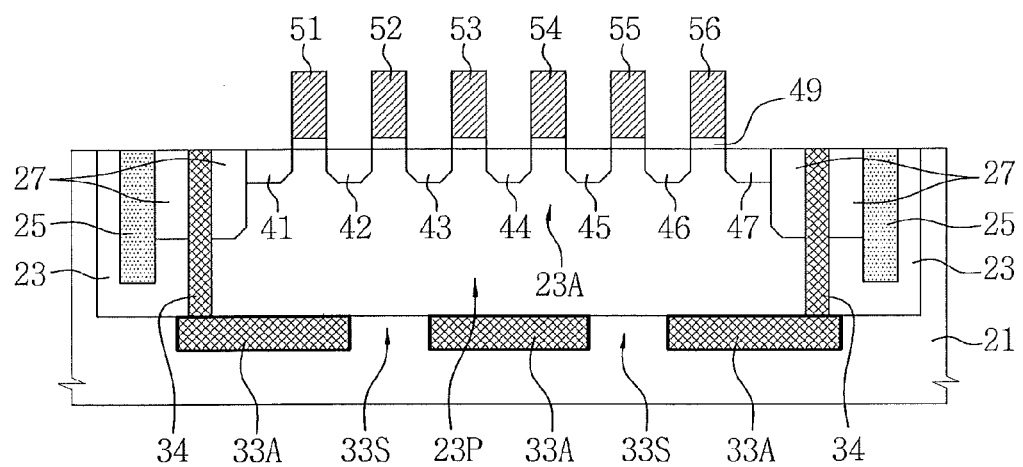
FIG. 12 is a cross-sectional view taken along line IV-IV' of FIG. 10.

FIG. 10 is a plan view of a semiconductor device according to a fourth embodiment of the inventive concept, FIG. 11 is a plan view of a part of the semiconductor device of FIG. 10, and FIG. 12 is a cross-sectional view taken along line IV-IV' of FIG. 10.

Referring to FIGS. 10, 11 and 12, a semiconductor device according to a fourth embodiment of the inventive concept may include P-wells 23, 23A and 23P, a P-type guard ring 25, an N-well 33A, and an N-type guard ring 34, all of which are formed in a P-type semiconductor substrate 21. The N-well 33A may include two slits 33S, which are separated from each other.

The P-wells 23, 23A and 23P may be divided into inner P-wells 23A and 23P and an outer P-well 23. The inner P-wells 23A and 23P may be divided into a first region 23A and a second region 23P. The N-well 33A may be formed under the inner P-wells 23A and 23P. An isolation layer 27 defining the first region 23A may be formed in the P-wells 23, 23A and 23P.

A plurality of gate electrodes 51, 52, 53, 54, 55 and 56 may be arranged across the first region 23A. The gate electrodes 51, 52, 53, 54, 55 and 56 may be configured of first to sixth gate electrodes 51, 52, 53, 54, 55 and 56 which are parallel to one another. A gate dielectric layer 49 may be interposed between the gate electrodes 51, 52, 53, 54, 55 and 56 and the first region 23A. Source regions 41, 43, 45 and 47 and drain regions 42, 44 and 46 may be disposed on the first region 23A of both sides of the gate electrodes 51, 52, 53, 54, 55 and 56.

The slits 33S may be disposed parallel to the gate electrodes 51, 52, 53, 54, 55 and 56. For example, the slits 33S may be aligned below and parallel to the second and fifth gate electrodes 52 and 55. The N-well 33A may be divided into three regions by the slits 33S.

The N-type guard ring 34 may pass between the inner P-wells 23A and 23P and the outer P-well 23 to be in contact with the N-well 33A. The second region 23P may be disposed under the first region 23A. The first and second regions 23A and 23P may be isolated from the outer P-well 23 by the N-type guard ring 34 and the isolation layer 27. However, the first and second regions 23A and 23P may be electrically connected with the P-type semiconductor substrate 21 through the slits 33S.

The P-type guard ring 25 may be provided outside the N-type guard ring 34. The P-type guard ring 25 may be in contact with the outer P-well 23. The P-type guard ring 25 may be electrically connected with the inner P-wells 23A and 23P via the outer P-well 23 and the P-type semiconductor substrate 21.

As described above, the N-well 33A may include the two slits 33S. The N-well 33A and the N-type guard ring 34 may constitute a slit well tub. The slits 33S may serve to provide an electrical connection path between the P-type guard ring 25 and the inner P-wells 23A and 23P. The electrical connection path between the inner P-wells 23A and 23P and the P-type guard ring 25 may be relatively lengthened and made uniform due to the presence of the N-well 33A, the slits 33S, and the N-type guard ring 34.

FIGS. 13 through 16 are partial plan views of a semiconductor device according to a fifth embodiment of the inventive concept. The following description will be briefly made only about differences between this embodiment and the other embodiments described with reference to FIGS. 1 through 12.

Figure 13:
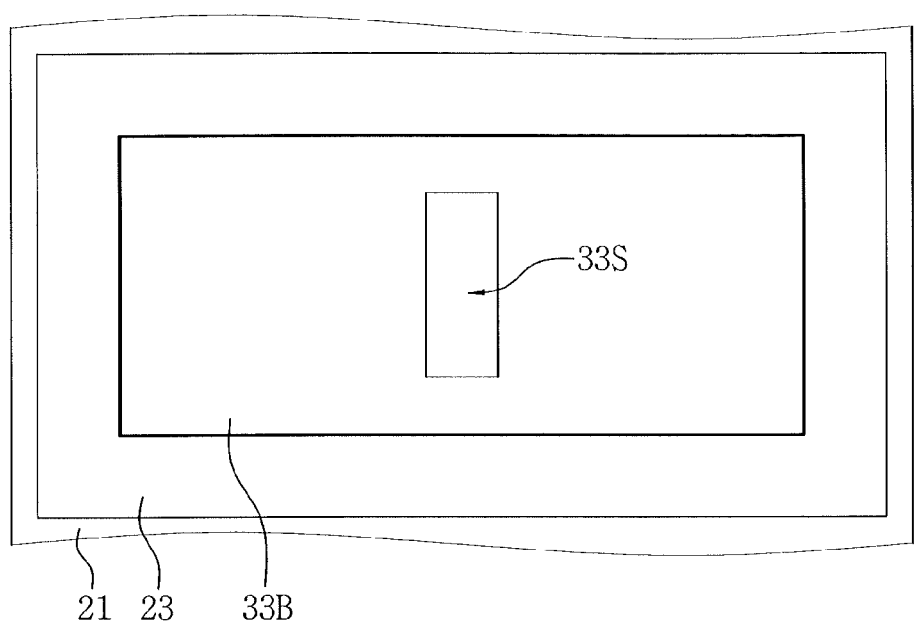
FIGS. 13 through 16 are partial plan views of a semiconductor device according to a fifth embodiment of the inventive concept.

Referring to FIG. 13, an N-well 33B having a slit 33S may be disposed on a P-type semiconductor substrate 21. The slit 33S may be a bar type. The slit 33S may be isolated in the middle of the N-well 33B. In this case, the N-well 33B may surround a circumference of the slit 33S, and be connected as one.

In some embodiments according to the inventive concept, the slit 33S may pass through one side of the N-well 33B. In another embodiment, the slit 33S may be one selected from the group consisting of an S-shape, a T-shape, a W-shape, a Z-shape, an O-shape, and a combination thereof.

Figure 14:
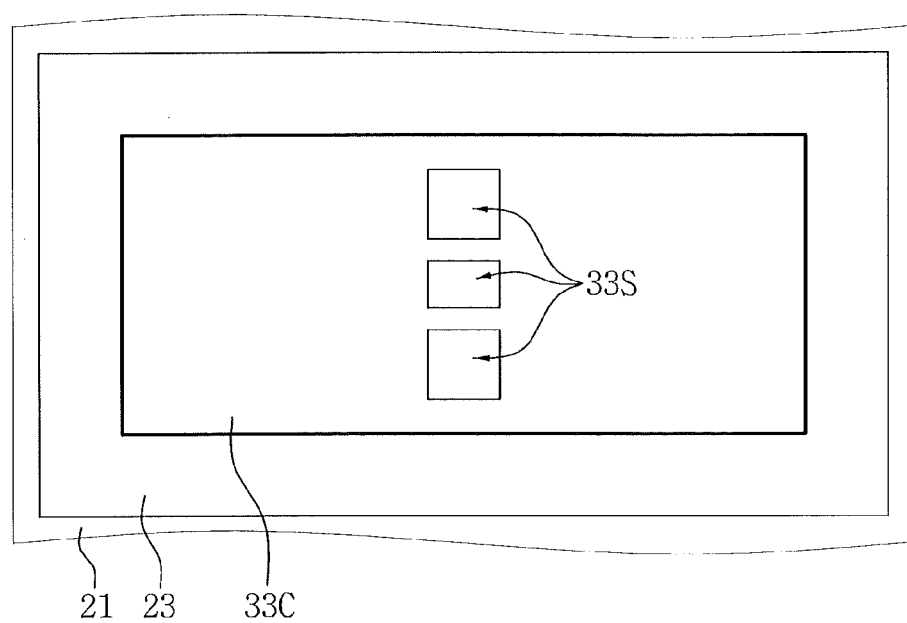

Referring to FIG. 14, an N-well 33C having slits 33S may be disposed on a P-type semiconductor substrate 21. The slits 33S may be three tetragonal slits which are aligned in a row. The three tetragonal slits may be separated from each other. The slits 33S may be isolated in the middle of the N-well 33C. In this case, the N-well 33C may surround circumferences of the slit 33S, and be connected as one.

Figure 15:
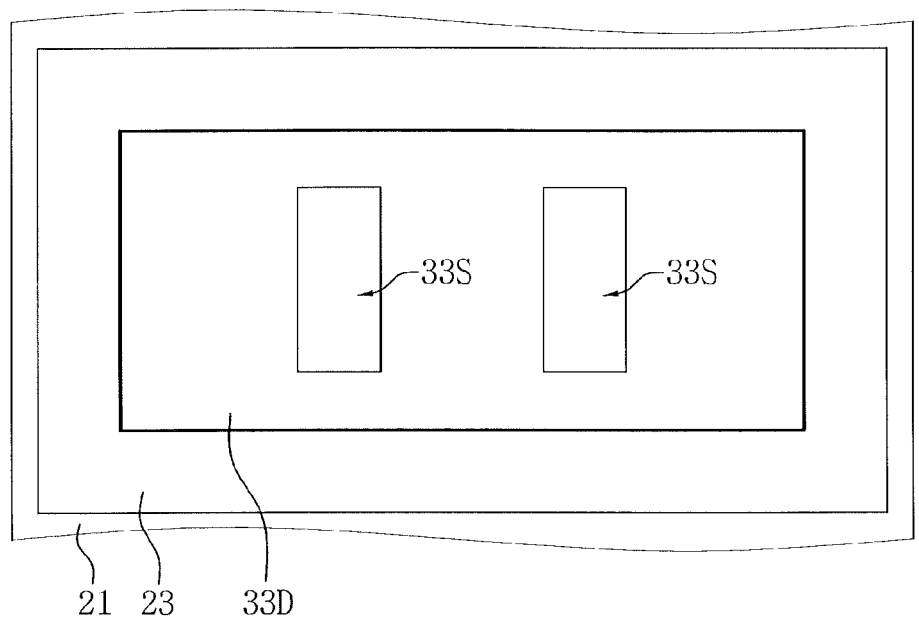

Referring to FIG. 15, an N-well 33D having slits 33S may be disposed on a P-type semiconductor substrate 21. The slits 33S may be a bar type. The slits 33S may be isolated in the middle of the N-well 33D, and be separated from each other. In this case, the N-well 33D may surround circumferences of the slits 33S, and be connected as one.

Figure 16:
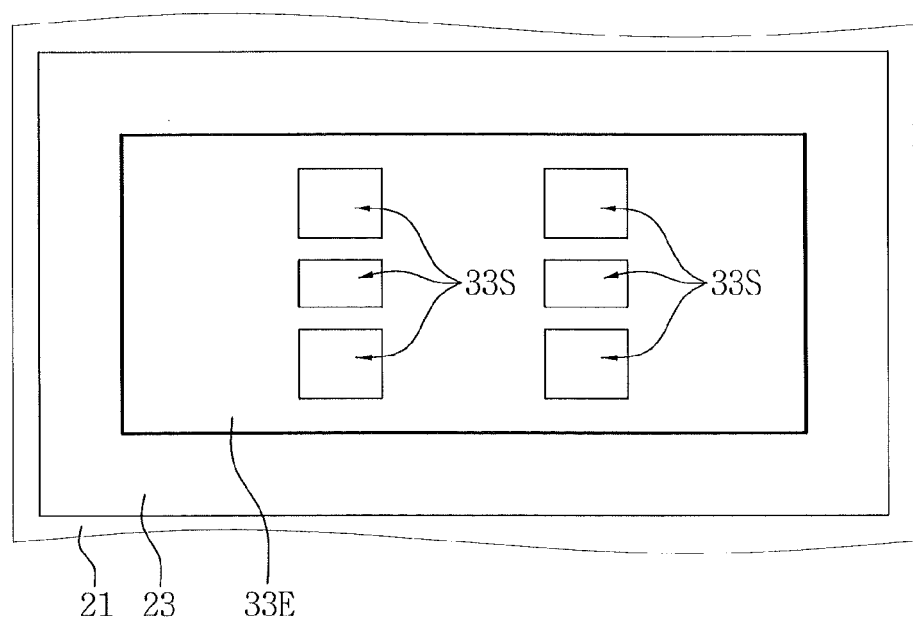

Referring to FIG. 16, an N-well 33E having slits 33S may be disposed on a P-type semiconductor substrate 21. The slits 33S may be sixth tetragonal slits which are aligned in two rows. The sixth tetragonal slits may be separated from each other. The slits 33S may be isolated in the middle of the N-well 33E, and be separated from each other. In this case, the N-well 33E may surround circumferences of the slits 33S, and be connected as one.

In some embodiments according to the inventive concept, the slits 33S may be configured of a plurality of holes aligned in row and column directions.

Figure 17:
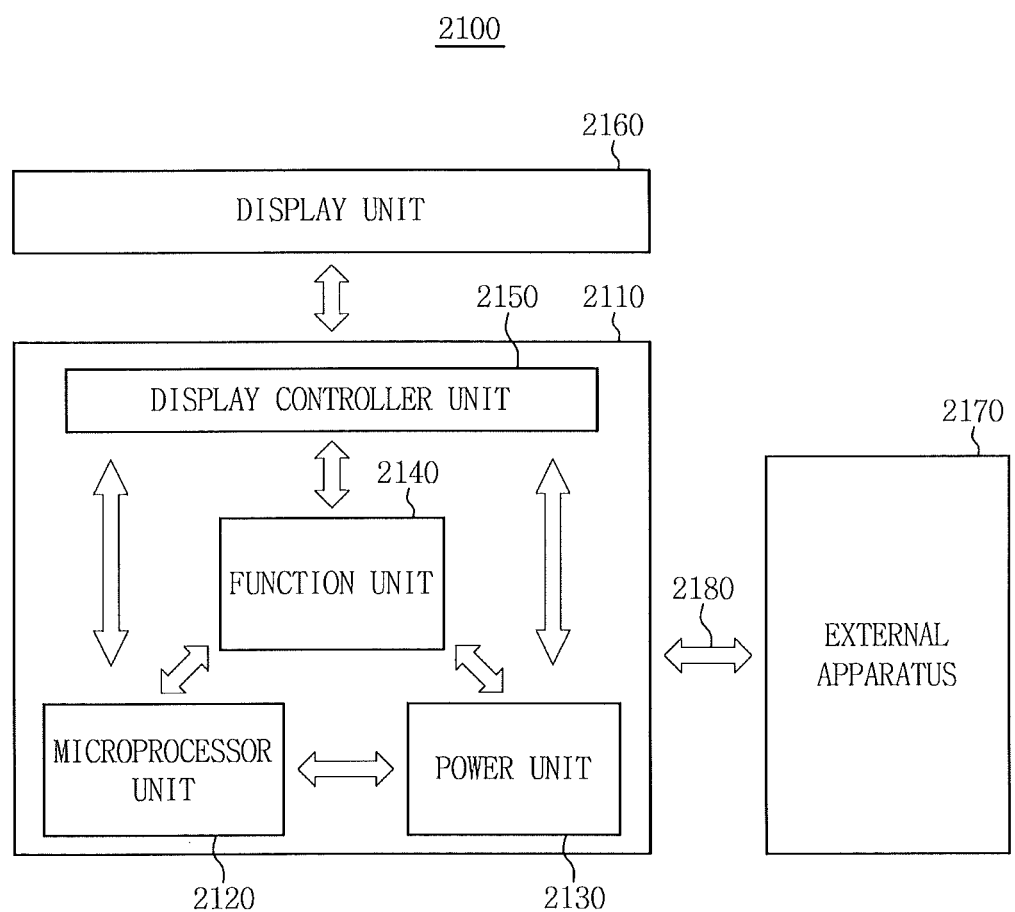
FIG. 17 is a block diagram of an electronic system having a semiconductor device according to a sixth embodiment of the inventive concept.

FIG. 17 is a block diagram of an electronic system according to a sixth embodiment of the inventive concept.

Referring to FIG. 17, a semiconductor device similar to that described with reference to FIGS. 1 through 16 may be applied to an electronic system 2100. The electronic system 2100 may include a body 2110, a microprocessor unit 2120, a power unit 2130, a function unit 2140, and a display controller unit 2150. The body 2110 may be a mother board configured of a printed circuit board. The microprocessor unit 2120, the power unit 2130, the function unit 2140, and the display controller unit 2150 may be mounted on the body 2110. A display unit 2160 may be disposed inside or outside the body 2110. For example, the display unit 2160 may be disposed on the body 2110, and display an image processed by the display controller unit 2150.

The power unit 2130 may be supplied with a predetermined voltage from an external battery (not shown), branch off the voltage into required levels of voltage, and supply the voltages to the microprocessor unit 2120, the function unit 2140, and the display controller unit 2150. The microprocessor unit 2120 may receive a voltage from the power unit 2130 to control the function unit 2140 and the display unit 2160. The function unit 2140 may carry out functions of the electronic system 2100. For example, if the electronic system 2100 is a mobile phone, the function unit 2140 may include various components capable of carrying out functions of the mobile phone, such as output of an image to the display unit 2160, output of voice to a speaker, etc. through dialing or communication with an external apparatus 2170. If the electronic system 2100 is equipped with a camera, the function unit 2140 may serve as a camera image processor.

In some embodiments, when the electronic system 2100 is connected with a memory card, etc. for capacity expansion, the function unit 2140 may be a memory card controller. The function unit 2140 may exchange signals with the external apparatus 2170 through a wired or wireless communication unit 2180. Furthermore, when the electronic system 2100 requires a universal serial bus (USB), etc. for function expansion, the function unit 2140 may serve as an interface controller.

The semiconductor device similar to that described with reference to FIGS. 1 through 16 may be applied to at least one of the microprocessor unit 2120 and the function unit 2140. For example, the I/O pad 15 (FIG. 4) may be disposed inside the microprocessor unit 2120 and/or the function unit 2140. The I/O pad 15 may be connected to a bond finger formed on the body 2110.

According to embodiments of the inventive concept, a semiconductor device provides a slit well tube configured of an N-well and an N-type guard ring. The N-well includes at least one slit. The slit serves to provide an electrical connection path between a P-type guard ring and inner P-wells. The inner P-wells are electrically connected to a ground interconnection via the slit, the P-type semiconductor substrate, the outer P-well, and the P-type guard ring. The electrical connection path between the inner P-wells and the P-type guard ring may be relatively lengthened and made uniform due to the presence of the N-well, the slit, and the N-type guard ring. Thus, it is possible to realize a ggNMOS, which has a structure advantageous for high integration and shows excellent response characteristics such as reduction in turn-on time, reduction in trigger voltage, reduction in holding voltage, and reduction in heating value. The ggNMOS can be applied as an ESD protection device.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device comprising:
 first inner conductive wells formed in a first conductive semiconductor substrate;
 a plurality of gate electrodes on the first inner conductive wells;
 source and drain regions in the first inner conductive wells;
 a first outer conductive well in the first conductive semiconductor substrate, and disposed outside the first inner conductive wells;
 a second conductive well under the source and drain regions, and having at least one slit therein; and
 a first conductive guard ring in the first outer conductive well, electrically coupled to the first inner conductive wells via the at least one slit.

2. The semiconductor device of claim 1, wherein the first and second conductivity types comprise opposite conductivity types.

3. The semiconductor device of claim 1, wherein the second conductive well separates portions of the first inner conductive wells from portions of the first conductive semiconductor substrate, and the first inner conductive wells are in contact with the first conductive semiconductor substrate through the at least one slit.

4. The semiconductor device of claim 1, further comprising:
 a second conductive guard ring between the first inner conductive wells and the first outer conductive well and in contact with the second conductive well.

5. The semiconductor device of claim 4, wherein the first inner conductive wells are separated from the first outer conductive well by the second conductive guard ring.

6. The semiconductor device of claim 4, wherein the first conductive guard ring is in contact with the second conductive guard ring.

7. The semiconductor device of claim 4, further comprising:
 an isolation layer between the first inner conductive wells and the first outer conductive well.

8. The semiconductor device of claim 7, wherein the isolation layer is between the second conductive guard ring and the source regions, and between the second conductive guard ring and the drain regions.

9. The semiconductor device of claim 8, wherein the isolation layer is between the first conductive guard ring and the second conductive guard ring.

10. The semiconductor device of claim 1, further comprising:
 an isolation layer between the first inner conductive wells and the first outer conductive well and in contact with the second conductive well.

11. The semiconductor device of claim 10, wherein the first inner conductive wells are separated from the first outer conductive well by the isolation layer.

12. The semiconductor device of claim 1, wherein the at least one slit is located at about a central portion of the second conductive well.

13. The semiconductor device of claim 1, wherein the at least one slit is aligned parallel to one of the plurality of gate electrodes.

14. The semiconductor device of claim 1, wherein the semiconductor device comprises an electrostatic discharge device further comprising:
   an input/output pad electrically connected to the drain regions; and
   a ground interconnection electrically connected to the gate electrodes, the source regions, and the first conductive guard ring.

15. A semiconductor device comprising:
   inner P-wells in a P-type semiconductor substrate;
   a plurality of gate electrodes on the inner P-wells;
   source and drain regions in the inner P-wells;
   an outer P-well in the P-type semiconductor substrate, outside the inner P-wells;
   an N-well between the inner P-wells and the P-type semiconductor substrate, and having at least one slit therein electrically connecting the inner P-wells and the P-type semiconductor substrate;
   an N-type guard ring between the inner P-wells and the outer P-well, and in contact with the N-well; and
   a P-type guard ring in the outer P-well,
   wherein the inner P-wells are in contact with the P-type semiconductor substrate through the at least one slit.

16. The semiconductor device of claim 15, wherein the inner P-wells are separated from the outer P-well by the N-well and the N-type guard ring.

17. The semiconductor device of claim 15, wherein the N-type guard ring is in contact with the P-type guard ring.

18. An electrostatic discharge semiconductor device comprising:
   a first conductivity type substrate including inner first conductivity type wells therein and a plurality of gate electrodes thereon in an active region thereof; and
   a second conductivity type well in the substrate beneath the plurality of gate electrodes including at least one slit therein providing electrical contact between the inner first conductivity type wells and a first conductivity type outer well outside the active region.

19. The device according to claim 18 wherein the active region is defined by an isolation layer in the substrate further comprising:
   a second conductivity type guard ring immediately adjacent to the active region contacting the second conductivity type well; and
   a first conductivity type guard ring outside the active region.

20. The device according to claim 19 further comprising:
   an input/output pad electrically connected to drain regions associated with the pluralities of gate electrodes; and
   a ground interconnection electrically connected to the gate electrodes, source regions associated with the pluralities of gate electrodes, and the first conductivity type guard ring.

* * * * *